United States Patent
Butterfield et al.

(10) Patent No.: US 8,063,975 B2
(45) Date of Patent: Nov. 22, 2011

(54) POSITIONING WAFER LENSES ON ELECTRONIC IMAGERS

(75) Inventors: Andrew Butterfield, Riverview, FL (US); Sebastien Fabre, Villeneuve-Loubet (FR); Karo Kujanpaa, Turku (FI)

(73) Assignee: Jabil Circuit, Inc., St. Petersburg, FL (US)

( * ) Notice: Subject to any disclaimer, the term of this patent is extended or adjusted under 35 U.S.C. 154(b) by 482 days.

(21) Appl. No.: 12/260,915

(22) Filed: Oct. 29, 2008

(65) Prior Publication Data

US 2010/0103308 A1  Apr. 29, 2010

(51) Int. Cl.
*H04N 5/225* (2006.01)

(52) U.S. Cl. ........................................ 348/340
(58) Field of Classification Search .................. 348/340
See application file for complete search history.

(56) References Cited

U.S. PATENT DOCUMENTS

| | | | |
|---|---|---|---|
| 2004/0012698 A1* | 1/2004 | Suda et al. | 348/315 |
| 2005/0007485 A1* | 1/2005 | Vook et al. | 348/345 |
| 2006/0028573 A1* | 2/2006 | Seo et al. | 348/340 |
| 2006/0132644 A1* | 6/2006 | Shangguan et al. | 348/374 |
| 2006/0181632 A1* | 8/2006 | Makii et al. | 348/335 |
| 2008/0136955 A1* | 6/2008 | Kathman et al. | 348/340 |
| 2008/0170151 A1* | 7/2008 | McAllister et al. | 348/340 |
| 2009/0284837 A1* | 11/2009 | Lake et al. | 359/619 |

* cited by examiner

*Primary Examiner* — Lin Ye
*Assistant Examiner* — Amy Hsu

(57) ABSTRACT

A low cost manufacturing method (300) and assembly (100) for positioning a lens (106) relative to an electronic imager (102). A viscous adhesive (104) is applied to the lens (106) or the electronic imager (102) outside of the optical path. The lens (106) is disposed on the electronic imager (102) exclusively with the adhesive (104) disposed between them.

33 Claims, 4 Drawing Sheets

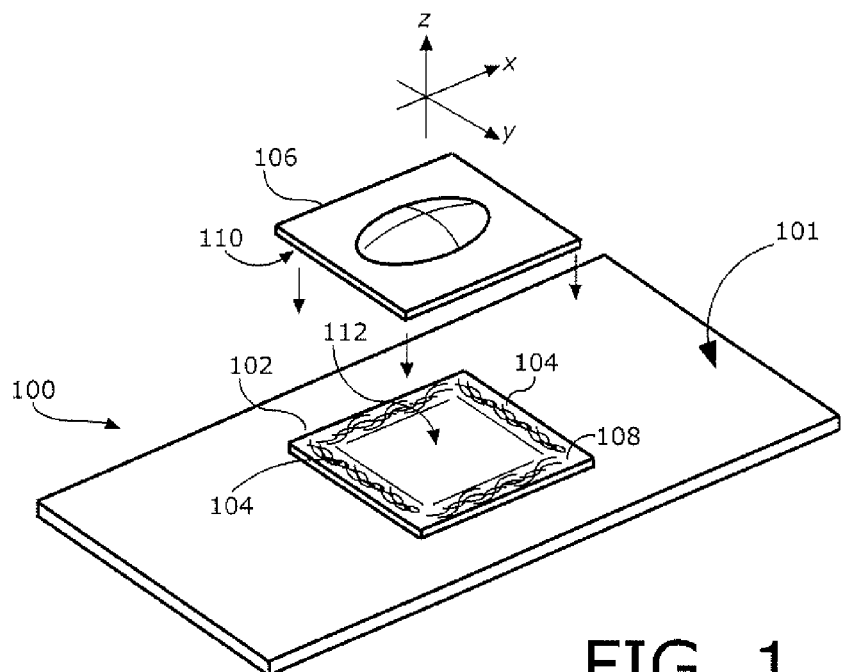
FIG. 1
FIG. 2
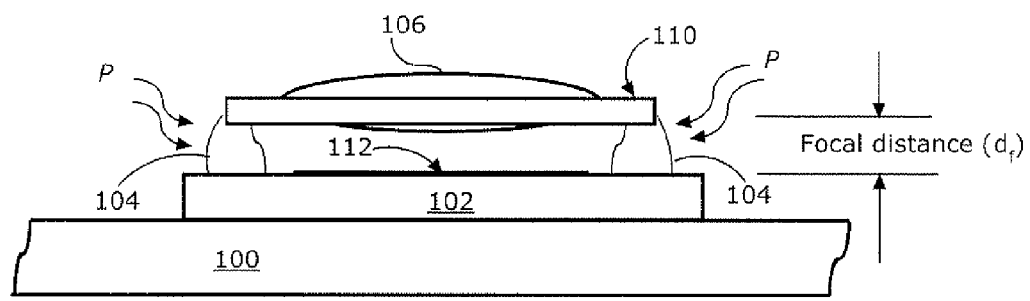

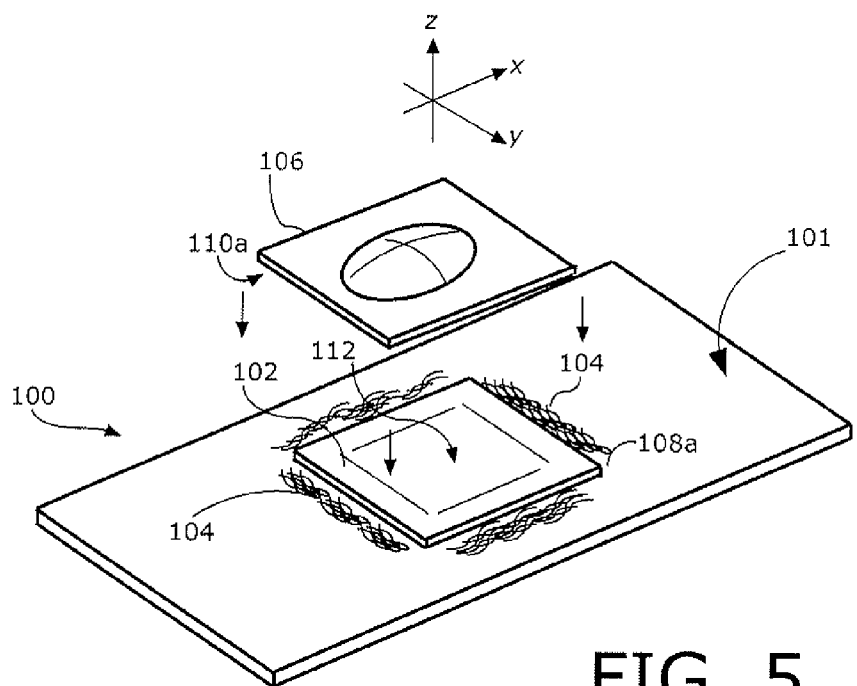
FIG. 5
FIG. 6
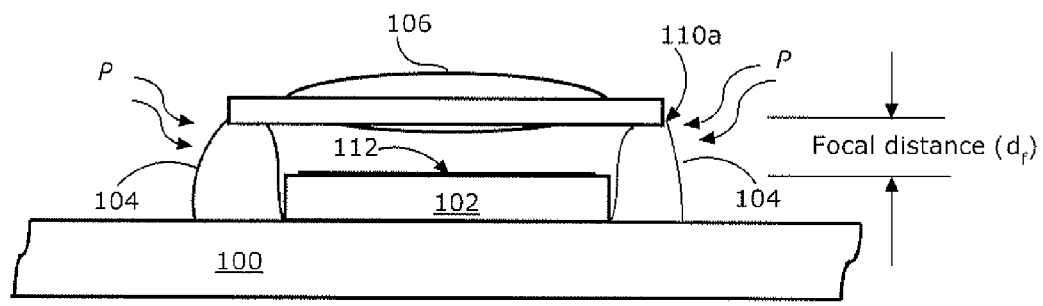

POSITIONING WAFER LENSES ON ELECTRONIC IMAGERS

BACKGROUND OF THE INVENTION

1. Field of the Invention

The present invention relates to imaging systems and more particularly to positioning of wafer lenses on imager dies.

2. Description of Related Art

Electronic imagers are commonly used in photo-imaging applications. The imager is typically formed from charge-coupled-devices (CCD) or complementary metal oxide semi-conductor (CMOS) devices. The imager contain many thousands of transistors which define pixels arranged in an array. The pixels are used to convert light into electrical signals that can then be stored and recalled by a processing device to produce an image.

Imagers can be formed in various structures. For example, they can be formed as separate imager dies, as part of chip scale packaging (CSP), or as part of through-silicon via (TSV) modules. Regardless of the particular construction, however, a lens is generally required to focus an image upon the pixels of an imager die. The lens must be positioned at a precise focal distance from the surface of the imager die in order to produce a sharp image. In the case of imagers used in devices such as mobile phones, the lens is typically set to a fixed focal position.

As the demand for smaller imaging devices has increased, optical tolerances become smaller, thereby increasing the level of precision required for positioning the lens relative to the imager. In many devices, the lens system is constructed directly on the imager, which means a method of attaching the lens to the imager is required. Conventional fabrication techniques use a lens barrel or a fixed stand-off to achieve the required focal length. However, conventional lens barrels or lens stand-offs can increase cost, and are not easily adjusted to achieve optimal image quality. For example, these techniques do not allow compensation for a wide range of tolerance issues within the lens, imager and any additional cover glass associated with the imaging device.

SUMMARY OF THE INVENTION

When assembling mobile phone cameras the lens is typically set to a fixed focal position. As the need for smaller reflowable cameras has increased the optical tolerances become smaller. This means a new method of alignment of the lens is required. Current cameras are based on the imager die itself, which means a method of attaching the lens to the imager is required.

The invention provides a low cost manufacturing solution for positioning the lens relative to the imager. A viscous adhesive, such as an epoxy, is applied to the lens or the imager outside of the optical path. The lens is disposed on the electronic imager with the adhesive disposed between them. The thickness or height of the adhesive is tall or thick enough such that when the elements are assembled in this way, the lens is too far from the electronic imager in relation to the focal length of the lens. Since the adhesive is not cured the lens can be aligned using the active alignment techniques currently used in some camera manufacturing applications. In this part of the process the imager is powered up such that a frame grabber can store images. The imager and lens are pointed toward a focusing target. The lens is then moved with five degrees of freedom until the optimal focus score is achieved.

The variations in spacing between the lens and the electronic imager are accommodated by the viscous adhesive during the lens alignment process. The adhesive is able to move and remain attached to the lens and imager as their relative position is changed. After alignment is achieved the adhesive is snap cured using an initiator, such as an ultraviolet light source, thereby fixing the lens into the optimal focal position. The solution eliminates the need for a lens barrel and/or a fixed standoff to achieve the focal length—hence reducing overall product cost. The stack of adhesive is the exclusive support mechanism for the lens in the completed assembly. The adhesive also allows the alignment system to compensate for a wide range of tolerance issues within the lens, the imager and any additional cover glass.

BRIEF DESCRIPTION OF THE DRAWINGS

FIG. 1 is a drawing which shows a exploded view of an imager and lens construction, which is useful for understanding the invention.

FIG. 2 is an enlarged side view of the imager and lens construction in FIG. 1 that is useful for understanding the invention.

FIG. 5 is a drawing which shows a exploded view of an imager and lens construction, which is useful for understanding an alternative embodiment of the invention.

FIG. 6 is an enlarged side view of the imager and lens construction in FIG. 5 that is useful for understanding the invention.

DETAILED DESCRIPTION

Figure 3:
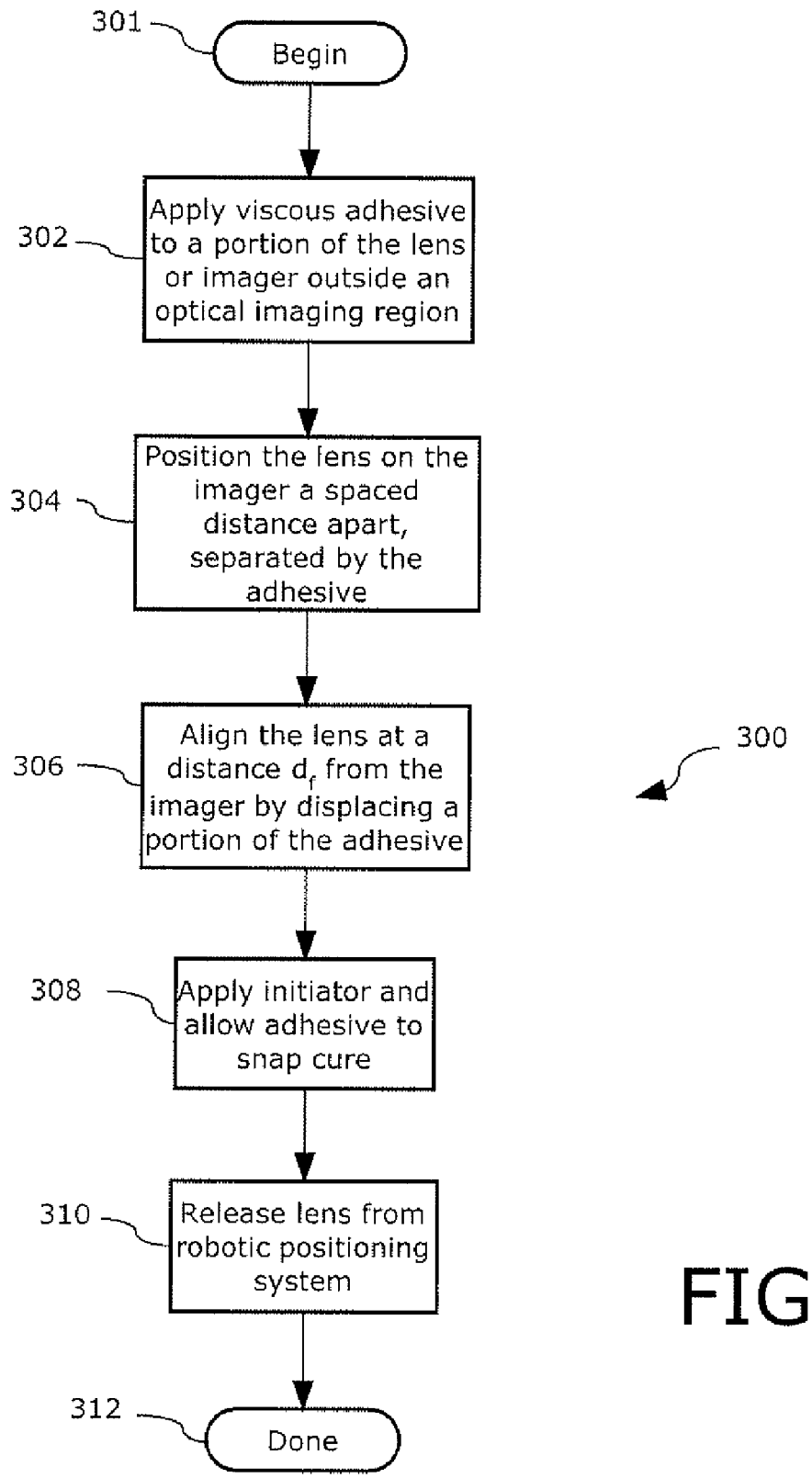
FIG. 3 is a flowchart showing a lens positioning method that is useful for understanding the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention. The present invention may be embodied in many different forms and should not be construed as limited to the embodiments set forth herein. For example, the present invention can be embodied as a method or a system.

Referring now to FIGS. 1 and 2, an imaging system 100 comprises a lens 106 and an electronic imager 102. In the embodiment shown, the electronic imager 102 is presented as an imager die disposed on a substrate 101. However, the invention is not limited in this regard and the electronic imager 102 can be integrated with the substrate. The electronic imager can be any type of electronic imaging device that is now known or may become known in the future. For example, and without limitation, the electronic imager 102 can a conventional charge-coupled-device (CCD) or complementary metal oxide semiconductor (CMOS) device. As will be appreciated by those skilled in the art, the electronic imager contains many thousands of transistors which define pixels arranged in an array 112. The pixels are used to convert light into electrical signals that can then be stored and recalled by a processing device to produce an image. One or more electrical contacts are provided on the electronic imager for power, control signals, and outputting image data responsive to the control signals. Electronic imagers of the type described herein are well known in the art.

The lens 106 can be any suitable type of lens useful for focusing an image on the electronic imager 102. Lenses of this type are well known in the art. For example, wafer lenses formed of plastic, glass, or other transparent material are commonly used for this purpose. The lens can be configured with a single layer or multiple layers of lenses. The lens or lenses can be single sided or double sided in nature. Multiple layers or stacks of lenses can be used to improve the final image quality of the camera. For wafer lenses the glass wafer can have an optically active surface on either side of the glass. In all cases lens or lenses are configured in such a way as to improve the final image quality across the full field of view. Whether using single or multiple lens configurations is determined by final cost and end user requirements.

Referring now to FIG. 3, a method 300 for positioning the lens 106 on the electronic imager 102 shall now be described in further detail. The process begins in step 301 and continues with step 302. In step 302, a viscous adhesive 104 is applied to a peripheral portion 108 of the electronic imager 102 or to a peripheral portion 110 of the lens 106 which is outside an optical imaging region of the lens and imager. The phrase "optical imaging region" as used herein refers to a region or volume between the lens and the electronic imager through which light rays pass in order for the entire area of the array 112 to be illuminated with an image projected from the lens 106. The adhesive 104 is advantageously applied on peripheral portion 108, 110 so that it does not generally interfere with the projection of optical images from the lens 106 upon the imaging surface defined by the array 112. Those skilled in the art will appreciate that it is desirable to keep the optical imaging region free from obstructions.

As shown in FIG. 2, the adhesive 104 is applied so that it is generally disposed between the peripheral portion 110 of lens 106 and the peripheral portion 108 of the electronic imager 102. An accumulation of the adhesive 104 is applied to one or both of these surfaces so that the total thickness of the adhesive between the lens and the electronic imager 102 is generally greater than a known focal distance $d_f$ of the lens 106. After the adhesive has been applied, the lens 106 is positioned generally as shown in FIG. 2.

In the present invention, adhesive 104 is the only structure used to position and orient the lens 106 relative to the array 112 of imager 102 in the completed imaging system 100. In other words, when the manufacturing of the imaging system 100 is completed, the lens 106 is maintained in a desired position and orientation relative to the electronic imager 102 without the need for any additional mechanical structure, such as a barrel or stand-off. In order to facilitate manufacturing of the product in this way, the adhesive 104 is advantageously selected to be have a relatively viscous form. For example, an adhesive with a viscosity of about 10,000+/−500 centipoise has been found to be acceptable for the process described herein. However, it should be understood that the invention is not limited in this regard, and other viscous adhesives can also be used without limitation.

The viscosity of adhesive 104 is advantageously selected to permit a stack or accumulation of adhesive having a sufficient thickness as described below. The thickness of the accumulated adhesive 104 allows lens 106 to be maintained and supported at a distance from array 112 as shown in FIG. 2. For example, this distance can be advantageously selected to be initially somewhat greater than a focal distance $d_f$ of the lens 106. Therefore, the viscous nature of the adhesive is helpful to achieve the necessary thickness of accumulation between the lens 106 and the electronic imager 102. A second function of the viscous adhesive is to provide an adjustable support structure during the alignment process for the lens 106 as described below. The viscous nature of the adhesive 104 maintains it in position. However, the adhesive can be partially displaced by the lens 106 when the lens is moved during an alignment process. This allows the lens to be adjusted in position relative to the electronic imager. The tack of the adhesive provides a further advantage as it allows the adhesive to remain attached to the lens and imager, even as the two elements are moved relative to one another.

The adhesive 104 advantageously includes at least one catalyst that is responsive to an initiator to cause a rapid curing of the adhesive. For example, the catalyst can be selected to be responsive to an energetic stimulus such as photonic radiation or heat. Examples of suitable types of photonic radiation include ultra-violet radiation. Various types of adhesive that satisfy these requirements are well known in the art and are commercially available. For example, a variety of epoxy resins are known that include at least one catalyst that is responsive to photonic radiation to cause the adhesive to cure quite rapidly. Ultra-violet light is one well known type of initiator used for such epoxy resins. When exposed to such photonic radiation or other initiator, such epoxy resins can have a snap cure cycle time of as little as ten seconds, and a full cure cycle time of as little as two (2) minutes. The snap cure is intended to stabilize the adhesive such that the initial adhesion and structural dimensions of the adhesive are maintained. The secondary cure is then necessary to establish full adhesion and full structural integrity of the adhesive. The abbreviated times for snap curing can greatly facilitate the manufacturing process, as will be understood from the description of the process hereinafter provided.

Referring once again to FIG. 3, the process continues in step 304 by positioning the lens on the electronic imager a spaced distance apart, separated by the adhesive 104. The lens is initially positioned on the adhesive such that the distance between the lens 106 and the array 112 is too great in relation to the focal length $d_f$ of the lens. Thereafter the method continues to step 306. Step 306 is an alignment step in which the lens 106 is precisely aligned at a distance $d_f$ from the array 112 of the electronic imager 102. This distance corresponds to the focal distance of the lens 106 and is the necessary distance to ensure proper focus of images projected by the lens onto the electronic imager.

Figure 4:
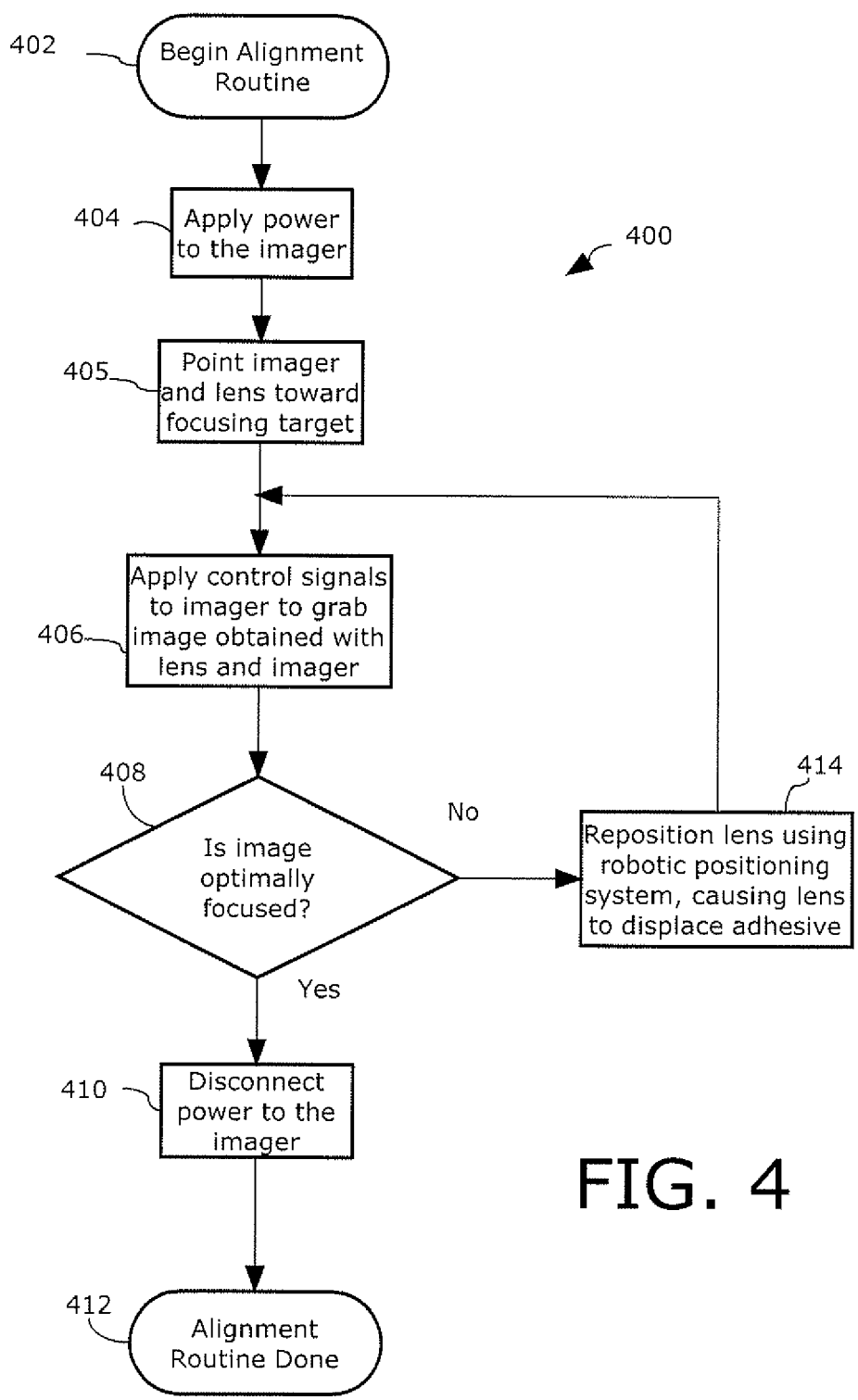
FIG. 4 is a flowchart showing an lens alignment procedure that is useful for understanding the invention.

The alignment step is described in more detail in FIG. 4. However, it should be understood that the alignment step can be facilitated by a computer controlled robotic positioning system that selectively adjusts the distance and/or orientation of the lens 106 relative to the array 112. The distance and orientation are adjusted by the robotic positioning system to achieve optimum focus. Note that the adhesive 104 will compensate for any variations in the distance between the lens and imager during this alignment process. In this regard, the adhesive 104 acts as a variable track mechanism that allows the lens to be moved with up to five degrees of freedom during the alignment process.

After the alignment process, an initiator is applied to the adhesive 104 to expedite the cure cycle time. The initiator is selected in accordance with a particular type of catalyst employed in the adhesive 104. For example, the initiator can be photonic radiation, such as ultraviolet light, or heat. The initiator results in a snap cure of the adhesive.

The initiator is preferably applied while the lens is maintained in a desired orientation and position as determined by the alignment step. For example, this holding task can be performed by a robotic positioning system following the alignment process. Still, the invention is not limited in this regard. Instead, following the alignment step, the position of the lens can be maintained entirely by the uncured adhesive prior to the application of the initiator in step 308. Once again, the viscosity of the adhesive is an important feature in this regard. In step 310, the lens can be released by the robotic positioning system. As noted above, this step can also be performed before step 308 in some applications if the adhesive is sufficiently viscous.

FIGS. 5 and 6 show an alternative embodiment of the invention. As illustrated therein, a viscous adhesive 104 is applied to a peripheral portion 108a surrounding the electronic imager 102 or to a peripheral portion 110a of the lens 106 which is outside an optical imaging region of the lens and imager. The adhesive 104 is advantageously applied on peripheral portion 108a, 110a so that it does not generally interfere with the projection of optical images from the lens 106 upon the imaging surface defined by the array 112.

As shown in FIG. 5, an accumulation of the adhesive 104 is applied so that its mass generally extends some distance between the lens 106 and the array 112 of the electronic imager 102. An accumulation of the adhesive 104 is applied to one or both of these surfaces 108a, 110a so that the total thickness of the adhesive between the lens and the electronic imager 102 is generally greater than a known focal distance $d_f$ of the lens 106. After the adhesive has been applied, the lens 106 is positioned generally as shown in FIG. 6.

The embodiment in FIGS. 5 and 6 is distinguishable from that shown in FIGS. 1 and 2 insofar as the adhesive is not supported directly on the surface of an imager die, but is instead supported on an adjacent structure. In FIGS. 5 and 6, the adjacent structure comprises a substrate 100 on which the imager 102 is supported. Still, the invention is not limited in this regard, and further alternatives are also contemplated to be within the scope of the invention.

Regardless of which embodiment of the invention is utilized, a sufficient intervening accumulation of adhesive is provided between non-adhesive structures supporting the lens and the imager to facilitate freedom of movement of the lens during the alignment process described below. Advantageously, with the adhesive 104 in an uncured state, there should be sufficient accumulated adhesive between the lens and imager array 112, so that lens 106 can be selectively variably adjusted in orientation and position as needed in a particular implementation to provide a precisely focused image on the array 112. The precise amount of adhesive accumulation required to facilitate such variable alignment can depend upon the accumulated tolerances of the imaging system components including the lens, substrate, imager, and so on.

Regardless of whether the embodiments of FIG. 1-2 or 5-6 is selected, various methods can be used to ensure precise alignment of lens 106 at a required distance and orientation relative to the array 112. A variety of automated optical alignment procedures are well known in the art. However, one example of a suitable alignment process 400 is described in FIG. 4 as an aid in understanding the invention.

Referring now to FIG. 4, the alignment process begins in step 402 and continues to step 404. In step 404, power is applied to the electronic imager 102 to activate the imaging function of the device. In step 405, the electronic imager and lens are pointed toward a focusing target. In step 406, control signals are applied to the electronic imager to grab an image frame using the lens and imager combination. Power and control signals are applied directly to electrical contacts provided on the electronic imager, or disposed on the substrate 101 and indirectly connected to the electronic imager. Suitable test jigs for applying power and control signals to the electronic imager 102 are well known in the art and therefore will not be described here in detail.

In step 408, a determination is made as to whether the image frame grabbed in step 406 is optimally focused. Various image processing algorithms are known in the art for evaluating the quality of focus achieved with a lens and electronic imager combination. Accordingly, the evaluation process will not be described in detail. However, it should be understood that any such evaluation process can be used, provided that it provides some mechanism for evaluating the relative quality of the focus that has been achieved by the combination of lens 106 and imager 102. If the image is not determined to be optimally focused in step 408, then the method continues to step 414. In step 414, the lens 106 is repositioned using the robotic positioning system. The lens can be moved with five degrees of freedom to iteratively optimize the focus. Compensation for the change in distance between the lens 106 and the electronic imager 102 is accommodated by the viscous adhesive as it is able to move and remain attached to the lens and the electronic imager.

Step 414 can be performed with the imager still pointing toward the focusing target. However, in some instances, it can be more convenient to reposition the imaging system 100 when adjusting the location of the lens with the robotic positioning system. Assuming that the imager and lens assembly is not repainted during the adjustment of the lens position, the process can continue directly with step 406. Otherwise, the assembly can be re-pointed toward the focusing target in step 405 before returning to step 406.

Following step 414, the process returns to step 406 where a new image frame is grabbed with the lens in its modified position relative to the electronic imager. The process then continues to step 408 where another determination is made as to whether optimal image quality has been achieved. Various algorithms can be used for controlling the iterative changes in position and orientation of the lens 106 during this process, without limitation. The goal is to determine a precise lens position (distance and orientation) relative to the electronic imager 102 that provides an optimally focused image. Once this goal is achieved, the process continues on to step 410, at which time the electronic imager is powered down. The alignment procedure thereafter ends in step 412.

All of the apparatus and methods disclosed and claimed herein can be made and executed without undue experimentation in light of the present disclosure. While the invention has been described in terms of preferred embodiments, it will be apparent to those of ordinary skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to one of ordinary skill in the art are deemed to be within the spirit, scope and concept of the invention as defined.

The invention claimed is:

1. A method for positioning a lens relative to an imager without use of a lens holder, comprising:
   disposing an accumulation of an adhesive having a viscous form, outside an optical imaging region of said lens and said imager, so that said adhesive exclusively bridges a distance between the lens and the imager;
   positioning said lens adjacent to said imager a spaced distance apart, separated by at least a portion of said adhesive;
   aligning said lens at a precise distance from said imager based on a focal length of said lens, by selectively displacing a portion of said adhesive.

2. The method according to claim 1, further comprising curing said adhesive while said lens is at said precise distance from said imager.

3. The method according to claim 2, further comprising selecting said adhesive to include an epoxy resin.

4. The method according to claim 1, further comprising curing said adhesive following said aligning step by exposing said adhesive to at least one initiator selected from the group consisting of heat and light.

5. The method according to claim 4, further comprising selecting said initiator to include ultra-violet light.

6. The method according to claim 4, further comprising selecting said adhesive to have a snap cure time which is less than about 1 minute.

7. The method according to claim 1, further comprising selecting a thickness of said adhesive applied to said lens or said imager to be greater than a focal length of said lens.

8. The method according to claim 1, wherein said aligning step further comprises adjusting an orientation of said lens relative to said imager.

9. The method according to claim 1, wherein said aligning step further comprises adjusting a lateral position of said lens relative to said imager by moving said lens in at least one direction transverse to a direction defined by said focal distance.

10. The method according to claim 1, further comprising selecting said adhesive to have a viscosity of about 10000±500 centipoise.

11. The method according to claim 1, further comprising automatically performing said alignment step by:
   applying electrical power to said imager; and
   evaluating an image produced by said imager with said lens in a selected position.

12. The method according to claim 11, further comprising selectively varying a position of said lens relative to said imager and repeating said evaluating step until an optimal image is determined to have been achieved with said imager and said lens.

13. The method according to claim 1, wherein said disposing step further comprises disposing said adhesive on at least one structure selected from the group consisting of a peripheral portion of said imager, and a surface at least partially surrounding said imager comprising a substrate on which said imager is disposed.

14. An imaging system, comprising:
   an electronic imager having an imaging surface comprising a plurality of pixels;
   a lens configured for focusing an image on said imaging surface, said lens having a lens position a predetermined distance from said imaging surface axially aligned with said imager so that a focal plane of said lens is generally parallel to said imaging surface; and
   a positioning structure securing said lens in said lens position relative to said imager, said positioning structure comprising an adhesive that fixes said lens in position relative to said imager without use of any intervening mechanical structure for positioning the lens.

15. The imaging system according to claim 14, wherein said adhesive is an epoxy resin.

16. The imaging system according to claim 14, wherein said adhesive comprises a catalyst which accelerates curing of said adhesive, and said catalyst is responsive to an initiator.

17. The imaging system according to claim 16, wherein said initiator is selected from the group comprising heat and light.

18. The imaging system according to claim 17, wherein said initiator is ultraviolet light.

19. The imaging system according to claim 16, wherein said adhesive has a snap cure time which is less than about 1 minute.

20. The imaging system according to claim 14, wherein a thickness of said adhesive between said lens and said electronic imager is equal to a focal length of said lens.

21. The imaging system according to claim 14, wherein said adhesive has a cured state and an uncured state, and has a viscosity of about 10000±500 centipoise in said uncured state.

22. A method for positioning a lens relative to an imaging surface defined by an imager, the lens having no lens barrel, comprising:
   applying an adhesive in an uncured state to a portion of the lens or the imager outside an optical imaging region of said lens and said imager, wherein the adhesive has a viscosity selected such that the adhesive provides for an adjustable support and positioning mechanism for the lens while in the uncured state;
   positioning said lens relative to said imager at a spaced distance apart, separated by said uncured adhesive;
   evaluating an image produced by said imager and said lens combination, while said adhesive is in an uncured state;
   selectively adjusting a position of said lens relative to said imager responsive to said evaluating step by repositioning said lens to displace a portion of said uncured adhesive; and
   curing the adhesive to fix a position of the lens relative to said imager.

23. An imaging system having a lens and imager fixed relative to each other without use of a lens holder, comprising:
   an electronic imager having an imaging surface;
   a lens that is configured to focus an image on the imaging surface;
   an adhesive material disposed about the imaging surface of the electronic imager that secures the lens in axial alignment with the imaging surface; and
   wherein the adhesive operates as a positioning structure for maintaining orientation of the lens with respect to the imaging surface so that a focal plane of said lens is generally parallel to said imaging surface.

24. The imaging system as in claim 23, wherein the adhesive includes a catalyst that is responsive to an initiator for accelerating curing of the adhesive.

25. The imaging system according to claim 23, wherein the adhesive has a viscosity of approximately 10000±500 centipoise when in an uncured state.

26. An imaging system, comprising:
   an electronic imager having an imaging surface;
   a lens for focusing an image on the imaging surface; and
   means for securing and orienting said lens with respect to said imager, said means comprising primarily of an adhesive selectively displaced about the imaging surface through active alignment of the lens.

27. The imaging system as in claim 26, wherein the adhesive includes a catalyst that is responsive to an initiator for accelerating curing of the adhesive.

28. The imaging system according to claim 27, wherein the adhesive means has a viscosity of approximately 10000±500 centipoise when in an uncured state.

29. A method for manufacturing a camera module, comprising the steps of:
    disposing an accumulation of uncured adhesive on an imager and on a lens, such that the adhesive is outside an optical imaging region of said lens and said imager, the adhesive having a viscous form that maintains a spaced apart distance between the lens and imager; and
    actively aligning the lens by selectively displacing a portion of said adhesive to adjust position and orientation of the lens relative to said imager thereby focusing the lens with respect to the imager; and
    after the step of actively aligning, curing the adhesive to fix the position and orientation of the lens relative to the imager.

30. The method according to claim 29, further comprising automatically performing said alignment step by:
    applying electrical power to said imager;
    evaluating an image produced by said imager with said lens in a selected position; and
    adjusting position and orientation of the lens relative to the imager based on evaluating the image.

31. An imaging system, comprising:
    a lens stack having no lens barrel;
    an electronic imager having an imaging surface, and a region outside the imaging surface;
    an adhesive material disposed on the electronic imager on the region outside the imaging surface; and
    wherein the lens stack is secured directly to the electronic imager by the adhesive material, without an intervening mechanical structure, and the lens stack is positioned by the adhesive relative to the imager such that a focal plane of said lens stack is generally parallel to said imaging surface.

32. The imaging system of claim 31, wherein the adhesive has a cured state derived from an uncured state, and when in the uncured state, the adhesive has a characteristic viscosity of approximately 10000±500 centipoise.

33. The imaging system of claim 31, wherein the adhesive has a thickness that varies between the lens stack and image to compensate for tolerances in the lens stack and the imager, thereby maintain the lens stack in axial alignment with respect to the imager.

* * * * *